United States Patent
Kratyuk et al.

(10) Patent No.: US 9,584,133 B2
(45) Date of Patent: Feb. 28, 2017

(54) TEMPERATURE COMPENSATED OSCILLATOR WITH IMPROVED NOISE PERFORMANCE

(75) Inventors: Volodymyr Kratyuk, Hillsboro, OR (US); Jeffrey L. Sonntag, Austin, TX (US); Aaron J. Caffee, Scappoose, OR (US)

(73) Assignee: Silicon Laboratories Inc., Austin, TX (US)

( * ) Notice: Subject to any disclaimer, the term of this patent is extended or adjusted under 35 U.S.C. 154(b) by 365 days.

(21) Appl. No.: 13/485,356

(22) Filed: May 31, 2012

(65) Prior Publication Data

US 2013/0320955 A1  Dec. 5, 2013

(51) Int. Cl.
| | |
|---|---|
| *G05F 1/577* | (2006.01) |
| *H03L 1/02* | (2006.01) |
| *G05F 3/24* | (2006.01) |
| *H03L 7/00* | (2006.01) |
| *H02M 3/07* | (2006.01) |
| *H01L 23/50* | (2006.01) |
| *H03K 3/011* | (2006.01) |
| *H03K 3/03* | (2006.01) |

(52) U.S. Cl.
CPC .............. *H03L 1/022* (2013.01); *G05F 3/242* (2013.01); *H03L 7/00* (2013.01); *H01L 23/50* (2013.01); *H01L 2924/0002* (2013.01); *H02M 3/07* (2013.01); *H03K 3/011* (2013.01); *H03K 3/03* (2013.01)

(58) Field of Classification Search
CPC .. H02M 3/07; H02M 3/073; H02M 2003/077; G11C 5/145; G11C 5/147; G05F 1/465; G05F 3/205; G05F 3/262; G05F 3/247; G05F 3/24

USPC ....... 323/266, 268, 273, 281, 313, 314, 907, 323/280; 363/59, 60
See application file for complete search history.

(56) References Cited

U.S. PATENT DOCUMENTS

| | | | |
|---|---|---|---|
| 4,825,142 A * | 4/1989 | Wang ............................ | 323/314 |
| 5,858,560 A * | 1/1999 | Nakamura et al. ........... | 428/690 |
| 6,509,722 B2 * | 1/2003 | Lopata ................ | H03F 3/45183 |
| | | | 323/275 |
| 6,747,497 B2 * | 6/2004 | Ingino, Jr. ..................... | 327/157 |
| 6,799,889 B2 * | 10/2004 | Pennock ....................... | 374/178 |

(Continued)

OTHER PUBLICATIONS

K. Sundaresan et al. "Process and Temperature Compensation in a 7-MHz CMOS Clock Oscillator". IEEE Journal of Solid-State Circuits. vol. 41. No. 2. Feb. 2006. pp. 433-442.*

(Continued)

*Primary Examiner* — Timothy J Dole
*Assistant Examiner* — Kevin H Sprenger
(74) *Attorney, Agent, or Firm* — Zagorin Cave LLP

(57) ABSTRACT

An oscillator system addresses power supply noise and temperature dependence. The system includes a multi-stage regulator circuit that receives a supply voltage and generates a lower voltage oscillator supply voltage that is less noisy than the supply voltage. A charge pump circuit receives the oscillator supply voltage and the oscillator output signal and supplies the regulator circuit with a boosted voltage. A reference generator circuit supplies a reference signal that is used to determine the oscillator supply voltage. The reference signal varies with temperature and is used to offset the temperature coefficient of the oscillator.

23 Claims, 4 Drawing Sheets

(56) References Cited

U.S. PATENT DOCUMENTS

| | | | |
|---|---|---|---|
| 7,755,419 B2* | 7/2010 | Rao et al. | 327/541 |
| 7,944,277 B1* | 5/2011 | Sinitsky et al. | 327/536 |
| 8,493,040 B2* | 7/2013 | Gunther et al. | 323/267 |
| 8,536,932 B2* | 9/2013 | Nguyen | 327/513 |
| 2008/0129271 A1* | 6/2008 | Fifield | 323/313 |
| 2010/0141223 A1* | 6/2010 | Wadhwa | 323/280 |
| 2013/0002224 A1* | 1/2013 | Lin | 323/285 |

OTHER PUBLICATIONS

Palumbo, Gaetano and Pappalardo, Domenico, "Charge Pump Circuits: An Overview on Design Strategies and Topologies," IEEE Circuits and Systems Magazine, First Quarter 2010, pp. 31-45.

Sundaresan, Krishnakumar et al., A 7-MHz Process, Temperature and Supply Compensated Clock Oscillator in 025um CMOS, IEEE, 2003, pp. I-693-I696.

Zheng, You and Saavedra, Carlos E., "Compact CMOS VCO Using a Transistor for Frequency Control," ANTEM/URSI, Jul. 17-19, 2006, pp. 115-118.

* cited by examiner

TEMPERATURE COMPENSATED OSCILLATOR WITH IMPROVED NOISE PERFORMANCE

BACKGROUND

Field of the Invention

This invention relates to oscillators and more particularly to oscillators that address power supply noise and/or temperature dependence issues.

Description of the Related Art

Low-cost applications typically restrict the use of resonator-based oscillators (such as LC oscillators) due to the large area associated with such oscillators. Alternative oscillator topologies (ring, RC-based, etc.) are usually very sensitive to power supply noise and temperature changes. Thus, improvements to address noise and temperature issues in low-cost applications are desirable.

SUMMARY OF EMBODIMENTS OF THE INVENTION

In an embodiment an apparatus includes a regulator circuit coupled to receive a first voltage and to supply a second voltage lower than the first voltage. An oscillator circuit is coupled to receive the second voltage and supply an oscillator output signal. A charge pump circuit is coupled to receive the second voltage and supply a third voltage larger than the second voltage to the regulator circuit. A reference generator circuit is coupled to supply a reference signal to the regulator circuit that corresponds to a voltage value of the second voltage.

In another embodiment a method is provided that includes supplying a first voltage to a regulator circuit. The regulator circuit generates a second voltage lower than the first voltage and supplies the second voltage to an oscillator circuit. The second voltage is also received at a charge pump circuit that increases the second voltage to a third voltage and supplies the third voltage to the regulator circuit. A reference signal is supplied to the regulator circuit, the reference signal corresponding to a voltage value of the second voltage.

In still another embodiment an apparatus includes a regulator circuit having a plurality of stages. The regulator circuit receives a first voltage at a first stage and supplies a second voltage lower than the first voltage from another of the stages. An oscillator circuit is coupled to receive the second voltage and supply an oscillator output signal. A charge pump circuit is coupled to receive the second voltage and the oscillator output signal and supply a third voltage larger than the second voltage to the regulator circuit. A reference generator circuit supplies a reference signal, which varies with temperature, to one or more of the stages of the regulator circuit, the reference signal determining, at least in part, a value of the second voltage.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
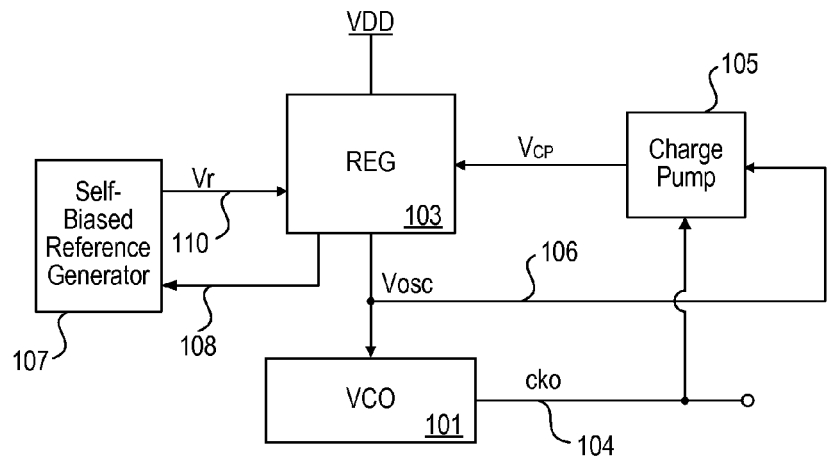
FIG. 1 illustrates a block diagram of an oscillator system according to an embodiment.

FIG. 1 illustrates a block diagram of an embodiment of a temperature compensated voltage-controlled oscillator (VCO) according to an embodiment of the invention. The system illustrated in the block diagram of FIG. 1 addresses power supply noise and temperature dependencies, which can lead to reduced VCO performance in terms of jitter or other undesirable artifacts in the VCO output.

FIG. 1 shows a voltage controlled oscillator (VCO) 101 coupled to receive its supply voltage Vosc from the regulator circuit 103. The regulator circuit regulates the supply voltage to reduce the undesirable effects of power supply noise on the output frequency of the VCO output signal, which is provided on node 104. In an embodiment described further herein, the oscillator supply voltage Vosc is regulated by a multi-stage regulator. The number of stages in any particular embodiment may vary according to system requirements. A charge pump circuit 105 receives the voltage signal Vosc from the regulator 103 on node 106, multiplies that voltage, and supplies the multiplied voltage to the operational amplifiers of the regulator 103. Use of the charge pump decouples inner regulator circuitry from the power supply supplying the voltage VDD and thus, improved power supply noise rejection is achieved. The charge pump 105 operates from the oscillator's clock signal (cko) supplied on node 104, thus producing only synchronous noise. In addition, use of the charge pump allows a higher voltage than VDD to be utilized by stages of the regulator.

Self-biased reference generator 107 produces a low-noise reference (Vr) voltage and supplies that reference voltage to regulator 103. The regulator 103 supplies a pre-regulated voltage on node 108 as the power supply for the self-biased regulator 107 to reduce the effect of power supply noise. The regulator supplies a replica of the reference voltage Vr as the oscillator voltage on node 106. The voltage Vr has a programmable temperature coefficient that offsets any residual temperature coefficient of the oscillator 101, so that the overall system may exhibit reduced or even near-zero temperature dependence. The temperature coefficient of Vr can be set during production test.

Figure 2:
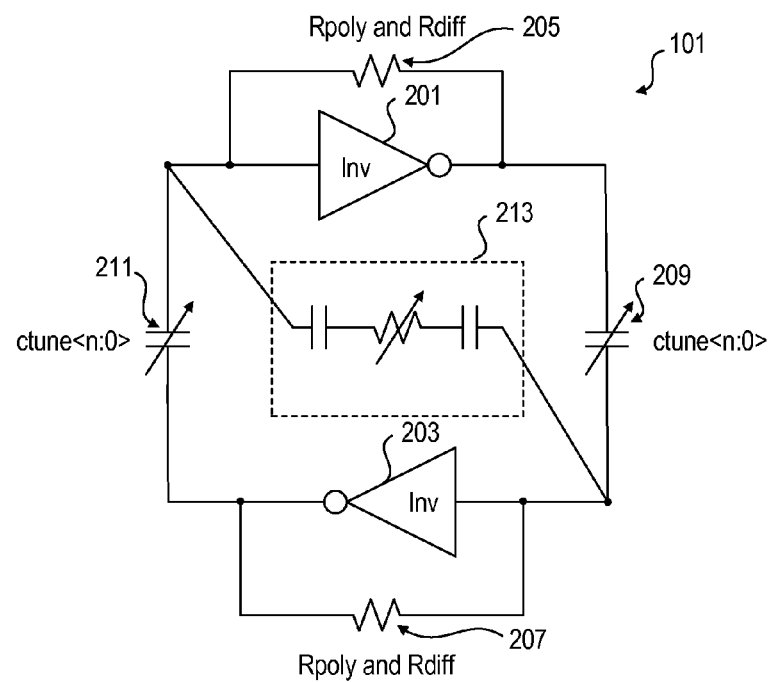
FIG. 2 illustrates a block diagram of an exemplary oscillator in an embodiment.

The VCO 101 may be implemented as a relaxation oscillator as illustrated in FIG. 2. Of course, other types of oscillators may be used that exploit advantages with respect to temperature dependence and power supply noise associated with various embodiments described herein. The exemplary oscillator shown in FIG. 2 includes two inverters 201 and 203 with resistive feedback through resistors 205 and 207. The two inverters 201 and 203 are cross-coupled by capacitors 209 and 211. The oscillation frequency of the oscillator depends not only on the inverter delays, but also on the RC time constant, which make this topology less sensitive to power supply noise. The capacitors 209 and 211 are tunable. Fine tuning may be provided by fine-tuning block 213 using the adjustable resistance in the fine-tuning block. In an embodiment, the feedback resistors include two different types of resistors. One resistor is formed by polysilicon (poly resistor) and a second resistor is formed as a diffusion resistor. Diffusion resistors are formed by diffusing, e.g., a p-type diffusion into an n-type region. Of course, other approaches to fabricating diffusion resistors are possible. The poly resistor and diffusion resistor have opposite temperature coefficients. That is, as temperature changes, the change in resistance is opposite. That arrangement allows reducing temperature dependence of the oscillator output signal frequency. The frequency of the oscillator 101 can also be controlled by changing the oscillator supply voltage Vosc. That is the control point for temperature dependence compensation by the self-biased reference generator circuit 107 through the reference voltage Vr used by the regulator 103 to generate Vosc.

Figure 3:
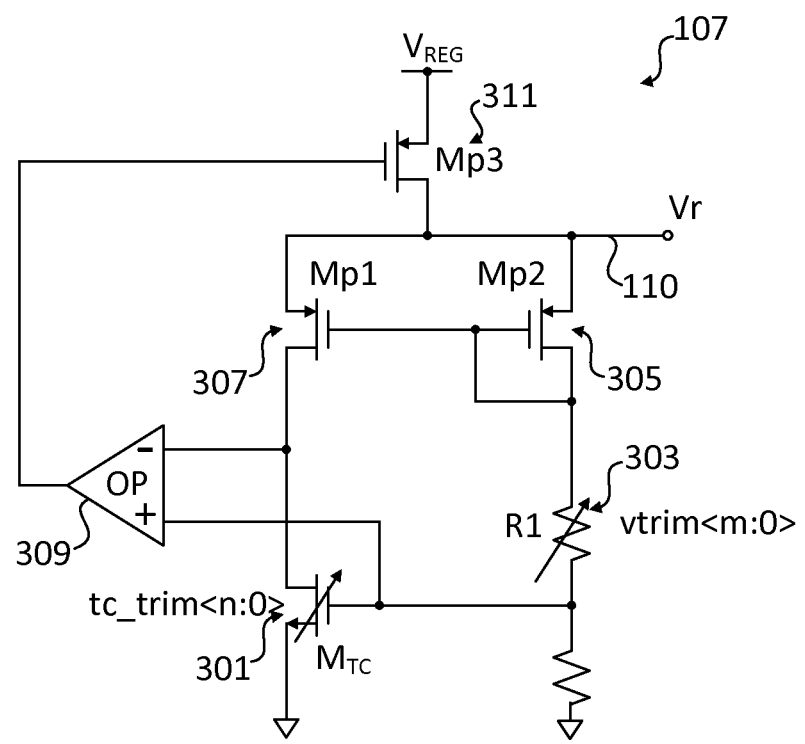
FIG. 3 illustrates a block diagram of an exemplary self-biased reference generator in an embodiment.

FIG. 3 illustrates an exemplary self-biased reference generator 107 having a variable temperature coefficient according to an embodiment. The output voltage reference Vr changes in response to change in temperature to compensate for the temperature coefficient of the oscillator. Although the oscillator may incorporate features to reduce its temperature dependence, any residual temperature dependence can be further addressed by adjusting Vr appropriately to even further temperature compensate the oscillator. The output voltage Vr, supplied on node 110 to the regulator 103 (see FIG. 1), is a combination of the threshold voltage (Vt)+(Vdsat) of the transistor $M_{TC}$ 301, the voltage drop over R1 303 and (Vt)+(Vdsat) of transistor Mp2 305. Vdsat is the drain to source voltage that keeps the transistor ($M_{TC}$ or Mp2) in the saturation region for a given gate to source voltage ($V_{GS}$). Vdsat and Vt change in opposite directions with change in temperature. In the embodiment illustrated in FIG. 3, CMOS transistors are utilized in contrast to bipolar transistors that are typically utilized in prior art approaches.

The approach shown in FIG. 3 controls the temperature coefficient of the circuit by changing the effective width/length ratio (W/L) of the transistor(s) forming $M_{TC}$. The self-biased reference generator can change the effective W/L of $M_{TC}$ by configuring a particular number of unit devices in parallel and/or series combinations that form $M_{TC}$ using the control signals tc_trim(n:0). The particular arrangement of the unit devices, e.g., the size and the number of unit devices, may vary based on the design requirements of the particular system. Thus, e.g., more unit devices of a smaller size may be used where more resolution over the temperature coefficient is desirable. The range of control over the temperature coefficient may be determined by both the number and size of unit devices. Thus, the temperature coefficient change is based, in one respect, on combining the opposite temperature dependence of the NMOS threshold voltage reflected in Vt and mobility reflected in Vdsat. Note that Vdsat is more sensitive to changes in W/L than Vt. Thus, if the W/L ratio is changed, the Vt and Vdsat ratio changes and the temperature dependence of the sum ((Vt)+(Vdsat)) changes. Note that the self-biased reference generator may include a start-up circuit (not illustrated) to ensure that the self-biasing operation starts properly.

In operation, the circuit of FIG. 3 creates a current through resistor R1 that is mirrored through transistor Mp1 307. The operational amplifier 309 tries to maintain the drain and gate voltages of transistor $M_{TC}$ 301 equal through the feedback path through transistor Mp3 311. The voltage ($V_{REG}$) supplied to the self-biased regulator is from an intermediate stage of the regulator circuit. That voltage is less noisy than if coming from the power supply VDD directly. The reference voltage Vr can also be adjusted by changing R1 using control values vtrim<m:0>. Vr can be adjusted by trimming R1 to account for process variations, and trimming of $M_{TC}$. During production testing, the integrated circuit may be heated to various temperatures and the oscillator output measured and the programmable components $M_{TC}$ and R1 adjusted to obtain the desired Vr and near-zero temperature dependence that is reflected in the desired oscillator output frequency. The appropriate adjustment values may be stored in on-chip non-volatile memory. Of course, because the values are programmable, in certain embodiments the adjustments to $M_{TC}$ and/or R1 may be made in the field on start-up, during operation, or more generally at times other than manufacturing testing.

In addition to controlling the temperature coefficient of the circuit shown in FIG. 3, as described above, additional approaches may be used in conjunction with or alternative to the embodiments described above. For example, in alternative embodiments, the W/L of Mp2 305 is changed and/or the resistance R1 is constructed with resistors that have different temperature coefficients. These approaches to controlling the temperature coefficient can be used in any appropriate combination to produce a reference voltage that changes as desired with temperature to maintain a stable oscillator output.

Figure 4:
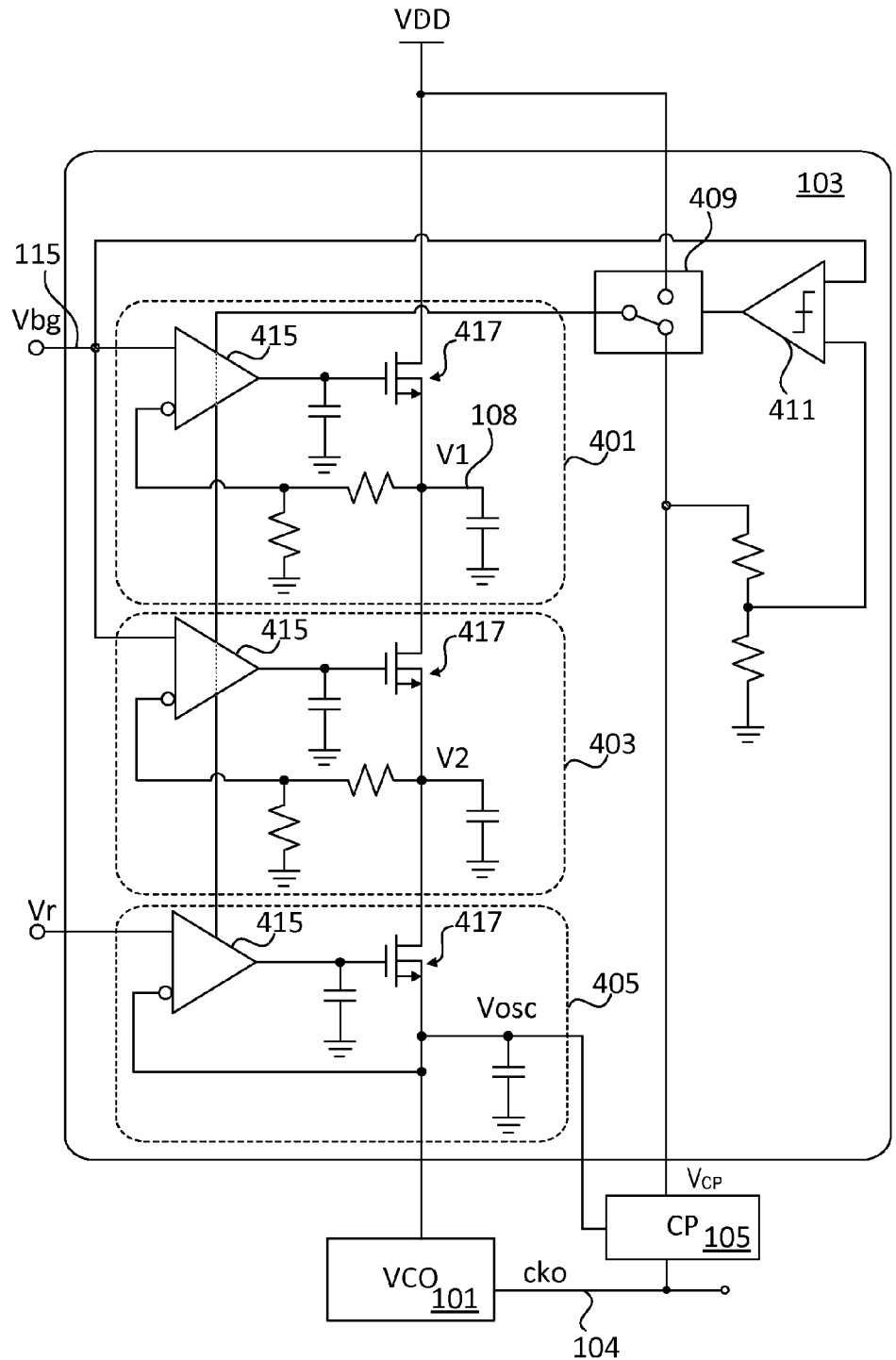
FIG. 4 illustrates a block diagram of an exemplary regulator circuit utilizing NMOS source follower stages.
Figure 5:
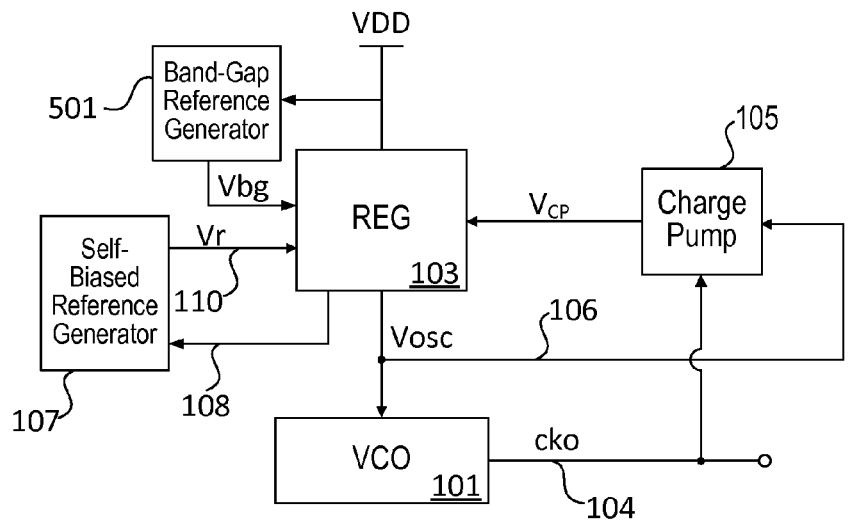
FIG. 5 illustrates a block diagram of an oscillator system according to an embodiment in which a band-gap circuit supplies another reference voltage.

Referring to FIG. 4, illustrated is an embodiment of the regulator 103 showing three stacked regulator stages 401, 403, and 405. Each of the stages is formed as an NMOS source follower stage and includes transistors 417. The reference voltage Vr is shown as being provided to the third stage 405. The voltage V1 is supplied to the reference generator 107 as the supply voltage $V_{REG}$ on node 108. The switch 409 and comparator 411 allow VDD to be used as the power source until the charge pump voltage is available for the operational amplifiers 415. A stable reference voltage (Vbg) may be used to provide a reference voltage for the operational amplifiers in stages 401 and 403. In other embodiments the reference voltage is supplied to all or multiple ones of the stages rather than Vbg. Referring to FIG. 5, Vbg is supplied from band-gap circuit 501. Each of the source follower stages includes an operational amplifier 415 coupled to receive the output voltage of the stage (V1, V2, or Vosc) and a band-gap reference voltage Vbg for stages 401 and 403 and the reference voltage for stage 405. The voltage Vosc is a close replica of the voltage value provided by the reference voltage. As can be seen, the oscillator 101 receives the supply voltage Vosc, which is also supplied to the charge pump. The charge pump also receives the oscillator output signal on node 104.

Figure 6:
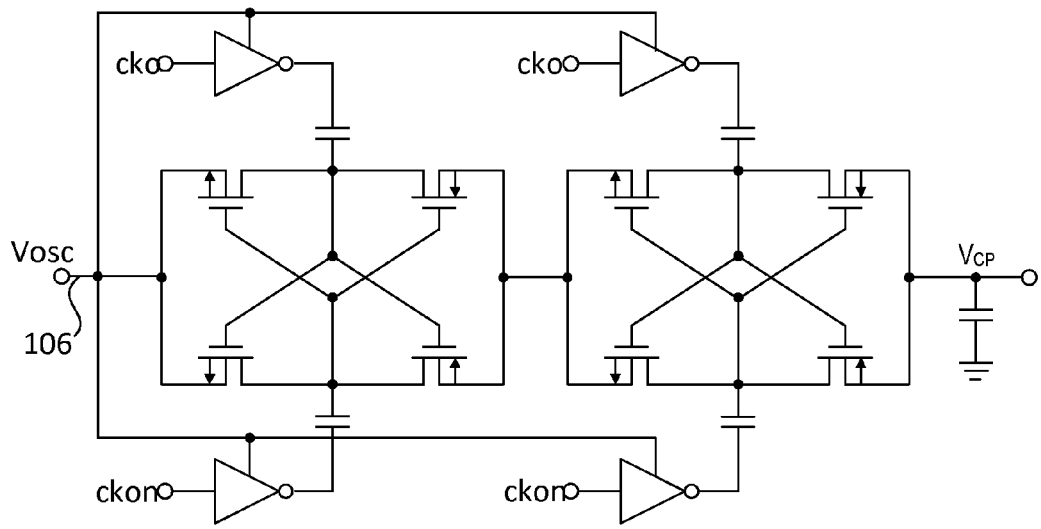
FIG. 6 illustrates a charge pump circuit according to an embodiment.

An embodiment of the charge pump circuit is shown in FIG. 6. The input voltage Vosc is the same supply voltage that is supplied to the oscillator 101. The output of the oscillator is supplied as a differential signal (cko and ckon) to drive the charge pump circuit. In an embodiment, the charge pump multiplies the input voltage Vosc 106 by approximately three. Other embodiments may use different multiplication factors according to the requirements of the regulator circuit.

The description of the invention set forth herein is illustrative, and is not intended to limit the scope of the invention as set forth in the following claims. Other variations and modifications of the embodiments disclosed herein may be made based on the description set forth herein, without departing from the scope of the invention as set forth in the following claims.

What is claimed is:

1. An apparatus comprising:
   a regulator circuit coupled to receive a first voltage and to supply a second voltage as a regulated voltage;
   an oscillator circuit coupled to receive the second voltage and supply an oscillator output signal;
   a charge pump circuit coupled to receive the second voltage and supply a third voltage larger than the second voltage to the regulator circuit,
   wherein the regulator circuit has a plurality of stages and wherein a first stage of the plurality of stages includes a first transistor coupled at a first current carrying terminal to an earlier one of the plurality of stages and the first transistor is coupled at a second current carrying terminal to supply the second voltage, the first stage further including a first stage operational amplifier coupled to receive the third voltage as a supply voltage and the first stage operational amplifier is coupled to receive as inputs a reference signal and the second voltage, and an output of the first stage operational amplifier is coupled to a gate of the first transistor; and
   a reference generator circuit coupled to supply as the reference signal a temperature sensitive reference signal to the regulator circuit, the reference signal corresponding to a voltage value of the second voltage.

2. The apparatus as recited in claim 1 wherein the apparatus is an integrated circuit.

3. The apparatus as recited in claim 1 wherein an output of one of the plurality of stages is supplied to the reference generator circuit as a reference generator supply voltage.

4. The apparatus as recited in claim 1 further comprising:
   a second reference generator circuit coupled to supply a stable reference signal to the regulator circuit.

5. The apparatus as recited in claim 1 wherein the reference generator circuit includes a device having a programmable effective width to length ratio, the device including a plurality of unit devices configurable to achieve the programmable effective width to length ratio.

6. The apparatus as recited in claim 5 further comprising:
   a device operational amplifier coupled to maintain a gate voltage and a drain voltage of the device substantially equal; and
   a second transistor having a gate terminal coupled to an output of the device operational amplifier, a first current carrying terminal of the second transistor coupled to a supply voltage from the regulator circuit and a second current carrying terminal of the second transistor supplying the reference signal.

7. The apparatus as recited in claim 5 wherein the reference generator circuit has a programmable resistance.

8. The apparatus as recited in claim 7 wherein the programmable resistance and the effective width to length ratio are selected in accordance with a temperature coefficient of the oscillator.

9. The apparatus as recited in claim 1 wherein the oscillator circuit comprises a first resistance having a first temperature coefficient and a second resistance having a second temperature coefficient and the first and second temperature coefficients have opposite polarities to thereby reduce temperature effects on the oscillator circuit output signal.

10. The apparatus as recited in claim 1 wherein the charge pump circuit is coupled to receive the oscillator output signal.

11. The apparatus as recited in claim 1 further comprising:
    a switch circuit coupled to select between the first voltage and the third voltage and to supply the third voltage as the supply voltage for the first stage operational amplifier only after the third voltage is determined to be available according to an output of a comparator circuit.

12. The apparatus as recited in claim 1 wherein a second stage of the plurality of stages includes a second transistor coupled at a third current carrying terminal to an earlier one of the plurality of stages and the second transistor is coupled at a fourth current carrying terminal to the first current carrying terminal of the first transistor, the second stage further including a second stage operational amplifier coupled to receive the third voltage as a supply voltage and an input of the second stage operational amplifier is coupled to the fourth current carrying terminal and an output of the second stage operational amplifier is coupled to a gate of the second transistor.

13. The apparatus as recited in claim 12 wherein a third stage of the plurality of stages includes third transistor having a fifth current carrying terminal coupled to the third current carrying terminal of the second transistor and a sixth current carrying terminal coupled to the first voltage, the third stage further including a third stage operational amplifier coupled to receive the third voltage as a supply voltage and an input of the third stage operational amplifier is coupled to the fifth current carrying terminal of the third transistor and an output of the third stage operational amplifier is coupled to a gate of the third transistor.

14. A method comprising:
    supplying a first supply voltage to one of a plurality of stages of a regulator circuit;
    generating a second voltage as a regulated voltage in the regulator circuit in another of the plurality of stages;
    supplying the regulated voltage to an oscillator circuit;
    supplying the first supply voltage as a power supply voltage to operational amplifiers of the plurality of stages of the regulator circuit;
    receiving the second voltage at a charge pump circuit, and increasing the second voltage to a third voltage;
    responsive to an output of a comparator circuit indicating the third voltage is available, switching from supplying the first supply voltage to supplying the third voltage from the charge pump circuit as the power supply voltage to the operational amplifiers of the plurality of stages of the regulator circuit; and
    supplying a reference signal from a reference generator circuit to the regulator circuit, the reference signal corresponding to a voltage value of the second voltage.

15. The method as recited in claim 14 further comprising supplying an output of one of the plurality of stages of the regulator circuit to the reference generator circuit as a supply voltage.

16. The method as recited in claim 14 further comprising adjusting the reference signal according to temperature in the reference generator circuit.

17. The method as recited in claim 14 further comprising configuring a device of the reference generator circuit to achieve a desired effective width to length ratio using a plurality of control signals.

18. The method as recited in claim 17 further comprising maintaining a gate and a drain voltage of the device substantially equal using an operational amplifier coupled to receive the gate and drain voltages.

19. The method as recited in claim 17 further comprising programming a programmable resistance of the reference generator circuit.

20. The method as recited in claim 14 configuring a device of the reference generator circuit using a plurality of programmable control lines, the device including a plurality of unit devices, to achieve a programmable width to length ratio of the device.

21. The method as recited in claim 14 further comprising:
selecting in a switch circuit between the first voltage and the third voltage;
supplying the third voltage as a supply voltage for operational amplifiers of the plurality of stages of the regulator circuit only after the third voltage is determined to be available according to an output of a comparator circuit; and
supplying the first voltage as the supply voltage for the operational amplifiers prior to the third voltage being available.

22. An apparatus comprising:
a regulator circuit having a plurality of stages, the regulator circuit coupled to receive a first voltage at a first stage and to supply a second voltage that is a regulated voltage from a second stage of the plurality of stages;
an oscillator circuit coupled to receive the second voltage and supply an oscillator output signal;
a charge pump circuit coupled to receive the second voltage and the oscillator output signal and supply a third voltage larger than the second voltage to the regulator circuit, wherein the first and second stages of the regulator circuit each have an operational amplifier coupled to receive the third voltage as a supply voltage; and
a reference generator circuit coupled to supply a reference signal, which varies with temperature, to at least one of the plurality of stages of the regulator circuit, the reference signal determining, at least in part, a value of the second voltage;
wherein the second stage is configured to have a source follower circuit and the operational amplifier of the second stage is coupled to receive as inputs the reference signal and the second voltage, an output of the operational amplifier of the second stage is coupled to a gate of a transistor of the source follower circuit, the transistor being coupled at a first current carrying terminal to an earlier one of the plurality of stages and coupled at a second current carrying terminal to supply the second voltage.

23. The apparatus as recited in claim 22 further comprising a band-gap circuit supplying a second reference signal to one or more of the plurality of stages of the regulator circuit.

* * * * *

UNITED STATES PATENT AND TRADEMARK OFFICE
CERTIFICATE OF CORRECTION

PATENT NO. : 9,584,133 B2
APPLICATION NO. : 13/485356
DATED : February 28, 2017
INVENTOR(S) : Volodymyr Kratyuk et al.

It is certified that error appears in the above-identified patent and that said Letters Patent is hereby corrected as shown below:

On the Title Page

Under abstract "23 Claims, 4 Drawing Sheets" should read --22 Claims, 4 Drawing Sheets--.

In the Claims

Column 7, Line 4-Column 8, Line 22, (approx.):
Delete Claims 21-23 and substitute therefore with the following Claims 21 and 22.

21. An apparatus comprising:
a regulator circuit having a plurality of stages, the regulator circuit coupled to receive a
    first voltage at a first stage and to supply a second voltage that is a regulated
    voltage from a second stage of the plurality of stages;
an oscillator circuit coupled to receive the second voltage and supply an oscillator output
    signal;
a charge pump circuit coupled to receive the second voltage and the oscillator output
    signal and supply a third voltage larger than the second voltage to the regulator
    circuit, wherein the first and second stages of the regulator circuit each have an
    operational amplifier coupled to receive the third voltage as a supply voltage; and
a reference generator circuit coupled to supply a reference signal, which varies with
    temperature, to at least one of the plurality of stages of the regulator circuit, the
    reference signal determining, at least in part, a value of the second voltage;
wherein the second stage is configured to have a source follower circuit and the
    operational amplifier of the second stage is coupled to receive as inputs the
    reference signal and the second voltage, an output of the operational amplifier of
    the second stage is coupled to a gate of a transistor of the source follower circuit,
    the transistor being coupled at a first current carrying terminal to an earlier one of
    the plurality of stages and coupled at a second current carrying terminal to supply
    the second voltage.

Signed and Sealed this
Ninth Day of October, 2018

Andrei Iancu
*Director of the United States Patent and Trademark Office*

22. The apparatus as recited in claim 21 further comprising a band-gap circuit supplying a second reference signal to one or more of the plurality of stages of the regulator circuit.